US009349592B2

(12) United States Patent
Hashimoto

(10) Patent No.: US 9,349,592 B2
(45) Date of Patent: May 24, 2016

(54) METHOD FOR MAKING ELECTRONIC DEVICE USING GROUP III NITRIDE SEMICONDUCTOR HAVING SPECIFIED DISLOCATION DENSITY OXYGEN/ELECTRON CONCENTRATION, AND ACTIVE LAYER THICKNESS

(71) Applicants: SixPoint Materials, Inc., Buellton, CA (US); Seoul Semiconductor Co., Ltd., Kasan-Dong, Keumchun-Gu, Seoul (KR)

(72) Inventor: Tadao Hashimoto, Santa Barbara, CA (US)

(73) Assignees: SixPoint Materials, Inc., Buellton, CA (US); Seoul Semiconductor Co., Ltd., Seoul (KR)

(*) Notice: Subject to any disclaimer, the term of this patent is extended or adjusted under 35 U.S.C. 154(b) by 86 days.

(21) Appl. No.: 14/460,121

(22) Filed: Aug. 14, 2014

(65) Prior Publication Data
US 2015/0017789 A1    Jan. 15, 2015

Related U.S. Application Data

(63) Continuation of application No. 14/329,730, filed on Jul. 11, 2014.

(60) Provisional application No. 61/845,043, filed on Jul. 11, 2013.

(51) Int. Cl.
*H01L 21/02* (2006.01)
*H01L 29/207* (2006.01)
(Continued)

(52) U.S. Cl.
CPC .......... *H01L 21/0254* (2013.01); *C23C 16/303* (2013.01); *H01L 21/0262* (2013.01);
(Continued)

(58) Field of Classification Search
CPC .............. H01L 21/0254; H01L 21/02636; H01L 29/207; H01L 29/201; H01L 29/2003; C30B 7/105; C30B 29/403; C30B 29/406
USPC .......................................... 438/503; 257/615
See application file for complete search history.

(56) References Cited

U.S. PATENT DOCUMENTS 8,222,650 B2 * 7/2012 Schowalter et al. ............ 257/79
2004/0124435 A1 * 7/2004 D'Evelyn et al. ............ 257/103
(Continued)

FOREIGN PATENT DOCUMENTS

WO    WO2011/044554 A1    4/2011

OTHER PUBLICATIONS

Johnstone, "Comparison of deep levels in GaN grown by MBE, MOCVD, and HVPE", Proc. of SPIE vol. 5739, p. 7 (2005).*
(Continued)

*Primary Examiner* — Peter Bradford
(74) *Attorney, Agent, or Firm* — Strategic Innovation IP Law Offices, P.C.

(57) ABSTRACT

The present invention discloses an electronic device using a group III nitride substrate fabricated via the ammonothermal method. By utilizing the high-electron concentration of ammonothermally grown substrates having the dislocation density less than $10^5$ cm$^{-2}$, combined with a high-purity active layer of $Ga_{1-x-y}Al_xIn_yN$ ($0 \leq x \leq 1$, $0 \leq y \leq 1$) grown by a vapor phase method, the device can attain high level of breakdown voltage as well as low on-resistance. To realize a good matching between the ammonothermally grown substrate and the high-purity active layer, a transition layer is optionally introduced. The active layer is thicker than a depletion region created by a device structure in the active layer.

17 Claims, 6 Drawing Sheets

(51) Int. Cl.
*H01L 29/78* (2006.01)
*H01L 29/812* (2006.01)
*C23C 16/30* (2006.01)
*H01L 29/861* (2006.01)
*H01L 29/872* (2006.01)
*H01L 29/20* (2006.01)
*H01L 29/201* (2006.01)
*H01L 29/417* (2006.01)
*H01L 29/06* (2006.01)
*H01L 29/205* (2006.01)

(52) U.S. Cl.
CPC .... *H01L21/02389* (2013.01); *H01L 21/02458* (2013.01); *H01L 21/02623* (2013.01); *H01L 29/207* (2013.01); *H01L 29/7828* (2013.01); *H01L 29/8122* (2013.01); *H01L 29/8611* (2013.01); *H01L 29/872* (2013.01); *H01L 29/0646* (2013.01); *H01L 29/0653* (2013.01); *H01L 29/201* (2013.01); *H01L 29/2003* (2013.01); *H01L 29/205* (2013.01); *H01L 29/41766* (2013.01)

(56) References Cited

U.S. PATENT DOCUMENTS

| | | | | |
|---|---|---|---|---|
| 2006/0208332 | A1* | 9/2006 | Duskin | H01L 29/0692 257/484 |
| 2007/0234946 | A1* | 10/2007 | Hashimoto | C30B 7/10 117/71 |
| 2008/0001165 | A1* | 1/2008 | Hashimoto et al. | 257/103 |
| 2009/0294775 | A1* | 12/2009 | Saito | C30B 23/02 257/76 |
| 2010/0219505 | A1* | 9/2010 | D'Evelyn | 257/615 |
| 2010/0270649 | A1* | 10/2010 | Ishibashi et al. | 257/615 |
| 2011/0220912 | A1* | 9/2011 | D'Evelyn | C30B 7/105 257/76 |
| 2011/0223092 | A1* | 9/2011 | Pimputkar | C30B 7/105 423/409 |
| 2014/0054595 | A1* | 2/2014 | Hashimoto | 257/76 |

OTHER PUBLICATIONS

PCT/US2014/046385 International Search Report and Written Opinion dated Mar. 17, 2015, pp. 21.
U.S. Appl. No. 14/329,730 Non-Final Office Action dated Feb. 12, 2015.
U.S. Appl. No. 14/460,097 Non-Final Office Action dated Feb. 18, 2015.
U.S. Appl. No. 14/329,730 Amendment dated May 12, 2015.
U.S. Appl. No. 14/460,097 Amendment dated May 15, 2015.
Chowdhury, Srabanti, et al. "Invited Review; Current Status and Scope of Gallium Nitride-Based Vertical Transistors for High-Power Electronics Application," This work was done at Department of Electrical and Computer Engineering, University of California, Santa Barbara, CA, Semiconductor Science and Technology, IOP Publishing, vol. 28, No. 7, XP020246912, doi: 10.1088/0268-1242/28/7/074014, pp. 8, Jun. 21, 2013.
Ehrentraut, Dirk, et al. "The Ammonothermal Crystal Growth of Gallium Nitride—A Technique on the Up Rise," Proceedings of the IEEE, New York, US, vol. 98, No. 7, pp. 1316-1323, XP011297473, doi: 10.1109/jproc2009.2029878, Nov. 17, 2009.
Sochacki, Tomasz, et al. "HVPE-GaN Growth on Ammonothermal GaN Crystals," Proceedings of the SPIE, vol. 8625, XP055138280, doi: 10.1117/12.2003699, pp. 11, Feb. 22, 2013.

* cited by examiner

METHOD FOR MAKING ELECTRONIC DEVICE USING GROUP III NITRIDE SEMICONDUCTOR HAVING SPECIFIED DISLOCATION DENSITY OXYGEN/ELECTRON CONCENTRATION, AND ACTIVE LAYER THICKNESS

CROSS REFERENCE TO RELATED APPLICATIONS

This application is a Continuation of U.S. patent application Ser. No. 14/329,730, filed Jul. 11, 2014, and entitled ELECTRONIC DEVICE USING GROUP III NITRIDE SEMICONDUCTOR AND ITS FABRICATION METHOD AND AN EPITAXIAL MULTI-LAYER WAFER FOR MAKING IT, inventor Tadao Hashimoto, which claims priority to U.S. App. 61/845,043, filed Jul. 11, 2013 and entitled ELECTRONIC DEVICE USING GROUP III NITRIDE SEMICONDUCTOR AND ITS FABRICATION METHOD, inventor Tadao Hashimoto, which the entire contents of each of the foregoing applications is incorporated by reference herein as if put forth in full below.

This application is also related to the following patent applications:

PCT Utility Patent Application Serial No. US2005/024239, filed on Jul. 8, 2005, by Kenji Fujito, Tadao Hashimoto and Shuji Nakamura, entitled "METHOD FOR GROWING GROUP III-NITRIDE CRYSTALS IN SUPERCRITICAL AMMONIA USING AN AUTOCLAVE,"

U.S. Utility patent application Ser. No. 11/784,339, filed on Apr. 6, 2007, by Tadao Hashimoto, Makoto Saito, and Shuji Nakamura, entitled "METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS," which application claims the benefit under 35 U.S.C. Section 119(e) of U.S. Provisional Patent Application Ser. No. 60/790,310, filed on Apr. 7, 2006, by Tadao Hashimoto, Makoto Saito, and Shuji Nakamura, entitled "A METHOD FOR GROWING LARGE SURFACE AREA GALLIUM NITRIDE CRYSTALS IN SUPERCRITICAL AMMONIA AND LARGE SURFACE AREA GALLIUM NITRIDE CRYSTALS,"

U.S. Utility Patent Application Ser. No. 60/973,602, filed on Sep. 19, 2007, by Tadao Hashimoto and Shuji Nakamura, entitled "GALLIUM NITRIDE BULK CRYSTALS AND THEIR GROWTH METHOD,"

U.S. Utility patent application Ser. No. 11/977,661, filed on Oct. 25, 2007, by Tadao Hashimoto, entitled "METHOD FOR GROWING GROUP III-NITRIDE CRYSTALS IN A MIXTURE OF SUPERCRITICAL AMMONIA AND NITROGEN, AND GROUP III-NITRIDE CRYSTALS GROWN THEREBY,"

U.S. Utility patent application Ser. No. 12/392,960, filed on Feb. 25, 2009, by Tadao Hashimoto, Edward Letts, Masanori Ikari, entitled "METHOD FOR PRODUCING GROUP III-NITRIDE WAFERS AND GROUP III-NITRIDE WAFERS,"

U.S. Utility patent application Ser. No. 12/455,760, filed on Jun. 4, 2009, by Edward Letts, Tadao Hashimoto, Masanori Ikari, entitled "METHODS FOR PRODUCING IMPROVED CRYSTALLINITY GROUP III-NITRIDE CRYSTALS FROM INITIAL GROUP III-NITRIDE SEED BY AMMONOTHERMAL GROWTH,"

U.S. Utility patent application Ser. No. 12/455,683, filed on Jun. 4, 2009, by Tadao Hashimoto, Edward Letts, Masanori Ikari, entitled "HIGH-PRESSURE VESSEL FOR GROWING GROUP III NITRIDE CRYSTALS AND METHOD OF GROWING GROUP III NITRIDE CRYSTALS USING HIGH-PRESSURE VESSEL AND GROUP III NITRIDE CRYSTAL,"

U.S. Utility patent application Ser. No. 12/455,181, filed on Jun. 12, 2009, by Tadao Hashimoto, Masanori Ikari, Edward Letts, entitled "METHOD FOR TESTING III-NITRIDE WAFERS AND III-NITRIDE WAFERS WITH TEST DATA,"

U.S. Utility patent application Ser. No. 12/580,849, filed on Oct. 16, 2009, by Tadao Hashimoto, Masanori Ikari, Edward Letts, entitled "REACTOR DESIGN FOR GROWING GROUP III NITRIDE CRYSTALS AND METHOD OF GROWING GROUP III NITRIDE CRYSTALS,"

U.S. Utility patent application Ser. No. 13/781,509, filed on Feb. 28, 2013, by Tadao Hashimoto, entitled "COMPOSITE SUBSTRATE OF GALLIUM NITRIDE AND METAL OXIDE,"

U.S. Utility patent application Ser. No. 13/781,543, filed on Feb. 28, 2013, by Tadao Hashimoto, Edward Letts, Sierra Hoff entitled "A BISMUTH-DOPED SEMI-INSULATING GROUP III NITRIDE WAFER,"

U.S. Utility patent application Ser. No. 13/833,443, filed on Mar. 15, 2013, by Tadao Hashimoto, Edward Letts, Sierra Hoff entitled "METHOD OF GROWING GROUP III NITRIDE CRYSTALS,"

U.S. Utility patent application Ser. No. 13/834,015, filed on Mar. 15, 2013, by Tadao Hashimoto, Edward Letts, Sierra Hoff entitled "METHOD OF GROWING GROUP III NITRIDE CRYSTALS,"

U.S. Utility patent application Ser. No. 13/834,871, filed on Mar. 15, 2013, by Tadao Hashimoto, Edward Letts, Sierra Hoff entitled "GROUP III NITRIDE WAFER AND ITS PRODUCTION METHOD,"

U.S. Utility patent application Ser. No. 13/835,636, filed on Mar. 15, 2013, by Tadao Hashimoto, Edward Letts, Sierra Hoff entitled "GROUP III NITRIDE WAFER AND ITS PRODUCTION METHOD,"

U.S. Utility patent application Ser. No. 13/798,530, filed on Mar. 13, 2013, by Tadao Hashimoto, entitled "GROUP III NITRIDE WAFERS AND FABRICATION METHOD AND TESTING METHOD,"

which applications are incorporated by reference herein in their entirety as if put forth in full below.

BACKGROUND

1. Field of the Invention

The invention relates to a semiconductor electronic device primarily used for high-power and/or high-frequency electric/electronic circuit. More specifically, the invention relates to e.g. diodes or transistors such as Schottky diodes, metal-semiconductor field effect transistors (MESFET), metal insulator semiconductor field effect transistors (MISFET), bipolar transistors, and heterobipolar transistors (HBT) using group III nitride semiconductor.

The invention also relates to a method of making such electronic devices.

The invention also relates to an epitaxial multi-layer wafer used to fabricate such electronic devices.

2. Description of the Existing Technology (Note: This patent application refers several publications and patents as indicated with numbers within brackets, e.g., [x]. A list of these publications and patents can be found in the section entitled "References.")

Gallium nitride (GaN) and its related group III nitride alloys are the key semiconductor material for various electronic devices such as power switching transistors. Despite the fact that the maximum performance of GaN theoretically predicted with Baliga's Figure of Merit (BFOM) exceeds that of silicon carbide (SiC) by ~5-fold, the lack of low-cost GaN wafers impedes development of GaN-based power switching transistors that can switch between two voltage levels quickly and with minimal loss. Currently, the majority of these devices are fabricated using a group III nitride film grown heteroepitaxially on a heterogeneous wafer, such as silicon, SiC and sapphire. However, heteroepitaxial growth of group III nitride results in highly defective or even cracked films. Typical defects in group III nitride heteroepitaxial films are threading dislocations at the level of $10^9$ cm$^{-2}$ along the growth direction. Because of this, vertical defects can become a current leakage path when high-voltage is applied vertically (i.e. along the growth direction). At this moment, GaN-based electronic devices are practically limited to horizontal devices such as high-electron mobility transistors (HEMT), which utilize current flow along the lateral directions near the surface. Since the electric current passes through a thin film in such horizontal devices, the thin film must have a large area to provide high-current (i.e. high-power) devices. In addition, all contacts are located on one side of the device, which makes the device much larger than a device having a vertical configuration. Due to these limitations, it is quite challenging to attain high-power devices in horizontal configuration of group III nitride semiconductors.

A homoepitaxial wafer or substrate such as GaN or AlN is required to provide a GaN-based electronic device with a vertical configuration. The lack of low-cost and high crystallinity GaN substrates originates from difficulties in growing bulk crystal of GaN and other group III nitride compounds. Currently, the majority of commercially available GaN wafers are produced by hydride vapor phase epitaxy (HVPE). HVPE is a vapor phase method in which it is difficult to make GaN having a dislocation density less than $10^5$ cm$^{-2}$ when GaN grown on heteroepitaxial wafers (e.g. sapphire). Furthermore, the manufacturing process involves removal of the heteroepitaxial wafer after growing a thick (more than 0.1 mm) GaN layer, which is quite labor intensive and results in low yield.

Ammonothermal growth has been developed [1-6] to obtain low-cost, high crystallinity GaN substrates in which the density of dislocations and/or grain boundaries is less than $10^5$ cm$^{-2}$. The ammonothermal method is one of the bulk growth methods of group III nitride crystals using supercritical ammonia. Growth rate of crystals in supercritical ammonia is typically low. To grow bulk GaN crystals at a practically useful rate to produce substrates, a chemical additive called a mineralizer is added to the supercritical ammonia. A mineralizer is typically an element or a compound of group I elements or group VII elements, such as potassium, sodium, lithium, potassium amide, sodium amide, lithium amide, ammonium fluoride, ammonium chloride, ammonium bromide, ammonium iodide and gallium iodide. Sometimes more than two kinds of mineralizers are mixed to attain a good growth condition. Although most of the alkali-based mineralizers are interchangeable, sodium is the most favorable mineralizer in terms of growth rate, purity and handling. GaN substrates having dislocation density less than $10^5$ cm$^{-2}$ are produced using sodium mineralizer in ammonothermal growth. However, to achieve high-power electronic device having a vertical configuration with ammonothermal group III nitride substrates (in which one electrode is on one side or surface of a substrate and its corresponding electrode is formed on an opposite side or surface of the substrate so that the substrate resides between the two electrodes), an innovative device structure and fabrication method is required.

SUMMARY OF THE INVENTION

The present invention provides, in one instance, an electronic device using a group III nitride substrate fabricated via the ammonothermal method. By utilizing the high-electron concentration of ammonothermally grown substrates having the dislocation density less than $10^5$ cm$^{-2}$, combined with a high-purity, low-carrier concentration active layer of $Ga_{1-x-y}Al_xIn_yN$ ($0 \leq x \leq 1$, $0 \leq y \leq 1$) grown by e.g. a vapor phase method, a device can be made that has a high breakdown voltage as well as low resistance when the device is in its "on" state ("on-resistance"). To realize a better match between the ammonothermally grown substrate and the high-purity, low-carrier concentration active layer, a transition layer is optionally introduced. The electronic device operates by changing a depletion region in the active layer. The high-purity, low-carrier concentration active layer is preferably sufficiently thick that the depletion region in the active layer does not extend through the active layer's entire thickness, and preferably the active layer is sufficiently thick to avoid the depletion region from extending into the interface and/or the substrate on which the high-purity, low-carrier concentration active layer resides.

Consequently, in one instance the invention provides an epitaxial multi-layer wafer for fabricating electronic devices. This wafer may comprise (i) a group III nitride substrate of $Ga_{1-x1-y1}Al_{x1}In_{y1}N$ ($0 \leq x1 \leq 1$, $0 \leq y1 \leq 1$) having a first side and a second side opposite to the first side and (ii) an active layer of $Ga_{1-x2-y2}Al_{x2}In_{y2}N$ ($0 \leq x2 \leq 1$, $0 \leq y2 \leq 1$) on the first side of the group III nitride substrate. The dislocation density of the group III nitride substrate may be less than $10^5$ cm$^{-2}$. The group III nitride substrate may also have an electron concentration and/or an oxygen concentration higher than $10^{18}$ cm$^{-3}$. The group III nitride substrate may be fabricated from a bulk crystal of $Ga_{1-x1-y1}Al_{x1}In_{y1}N$ ($0 \leq x1 \leq 1$, $0 \leq y1 \leq 1$) grown in supercritical ammonia. The active layer may be an epitaxially deposited layer which has an electron and/or an oxygen concentration lower than $10^{18}$ cm$^{-3}$. The active layer may have a thickness sufficiently large that a depletion region which is formed in the active layer after fabricating the electronic device with a first electrode on the first side of the wafer and a second electrode on the second side of the wafer is outside of the substrate.

The invention also provides an electronic device that includes a wafer as set out above and elsewhere herein. One of the electrodes may be on a first face of the wafer, and another of the electrodes may be on a second, opposite face of the wafer. The electrodes may cooperate to form e.g. a transistor or diode as the electronic device.

The invention in another instance provides a new method of making a multi-layer wafer. The method may comprise epitaxially depositing from vapor phase an active layer of $Ga_{1-x2-y2}Al_{x2}In_{y2}N$ ($0 \leq x2 \leq 1$, $0 \leq y2 \leq 1$) upon a first side of a substrate of $Ga_{1-x1-y1}Al_{x1}In_{y1}N$ ($0 \leq x1 \leq 1$, $0 \leq y1 \leq 1$), where the substrate was formed by an ammonothermal method. The active layer may have a thickness sufficiently large that a depletion region which is formed in the active layer after fabricating an electronic device with a first electrode on the first side of the wafer and a second electrode on a second, opposite side of the wafer is outside of the substrate. The substrate may have an oxygen concentration and/or an electron concentration of greater than $10^{18}$ cm$^{-3}$, and the vapor phase may have a sufficiently low concentration of oxygen and/or concentration of electron donor to provide an oxygen concentration and/or an electron concentration in the active layer of less than $10^{18}$ cm$^{-3}$.

The invention further provides a new electronic device. This device may comprise a substrate of $Ga_{1-x1-y1}Al_{x1}In_{y1}N$ ($0 \leq x1 \leq 1$, $0 \leq y1 \leq 1$), an active layer of $Ga_{1-x2-y2}Al_{x2}In_{y2}N$ ($0 \leq x2 \leq 1$, $0 \leq y2 \leq 1$) on a first side of the substrate, and a back ohmic contact on a second side of the substrate that is opposite to the first side of the substrate.

The contacts of the device may form a depletion region in the active layer that has a depth, and the active layer may have a thickness greater than the depth of the depletion region for any applied voltage within an operation range of the device. Further or instead, the active layer and the transition layer may have a combined thickness that is greater than the depth of the depletion region for any applied voltage within the operation range of the device.

The substrate of a device as discussed above or elsewhere herein may have a dislocation density of less than $10^5$ cm$^{-2}$. The substrate may have an electron concentration and/or an oxygen concentration greater than $10^{18}$ cm$^{-3}$. The active layer of a device as discussed above or elsewhere herein may have an electron concentration and/or an oxygen concentration of less than $10^{18}$ cm$^{-3}$.

The invention also provides a new method of fabricating an electronic device. The method may comprise growing an active layer of $Ga_{1-x2-y2}Al_{x2}In_{y2}N$ ($0 \leq x2 \leq 1$, $0 \leq y2 \leq 1$) by vapor phase epitaxy on a first side of a substrate of $Ga_{1-x1-y1}Al_{x1}In_{y1}N$ ($0 \leq x1 \leq 1$, $0 \leq y1 \leq 1$) sliced from a bulk crystal of $Ga_{1-x1-y1}Al_{x1}In_{y1}N$ ($0 \leq x1 \leq 1$, $0 \leq y1 \leq 1$) grown in supercritical ammonia. The method may comprise forming an Ohmic contact on a second side of the substrate and/or forming a Schottky contact, metal-insulator-semiconductor structure or p-type semiconductor on the active layer. The depletion region may be solely within the active layer, so that the depth of the depletion region is less than the thickness of the active layer for any applied voltage within an operation range of the device. Alternatively, the depletion region may extend through the active layer and into a transition layer. In this latter instance, the depth of the depletion region may be greater than the thickness of the active layer but less than the thickness of the active layer plus the thickness of a transition layer. It is, of course, not necessary that the depth of the depletion region is greater than the thickness of the active layer but less than the combined thickness of the active layer and a transition layer when a transition layer is provided in this method. The substrate may have a dislocation density of less than $10^5$ cm$^{-2}$. The substrate may have an electron concentration and/or an oxygen concentration higher than $10^{18}$ cm$^{-3}$. The active layer may have an electron concentration and/or an oxygen concentration of less than $10^{18}$ cm$^{-3}$.

These substrates, wafers, devices, and methods are provided by way of example and not by way of limitation.

BRIEF DESCRIPTION OF THE DRAWINGS

Referring now to the drawings in which like reference numbers represent corresponding parts throughout.

In the figure each number represents the following:
 1. Back ohmic contact
 2. Substrate
 3. Active layer
 4. Schottky contact
 5. Transition layer

DETAILED DESCRIPTION OF THE INVENTION

BACKGROUND

Overview

Figure 1:
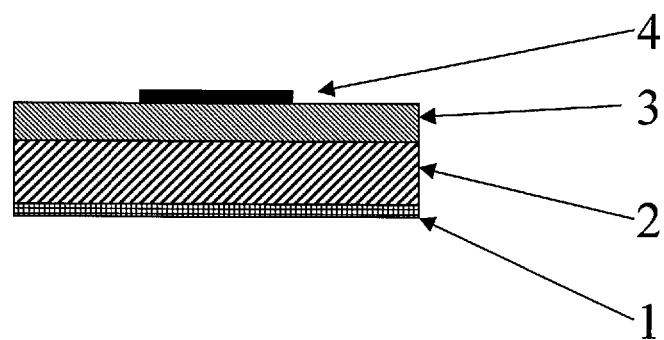
FIG. 1 is one example of electronic device using group III nitride.
In the figure each number represents the following:
 1. Back Ohmic contact
 2. Substrate
 3. Active layer
 4. Schottky contact

To attain high breakdown voltage as well as low on-resistance, the current invention utilizes a group III nitride substrate of $Ga_{1-x1-y1}Al_{x1}In_{y1}N$ ($0 \leq x1 \leq 1$, $0 \leq y1 \leq 1$) which is sliced from a bulk crystal of $Ga_{1-x1-y1}Al_{x1}In_{y1}N$ ($0 \leq x1 \leq 1$, $0 \leq y1 \leq 1$) grown by the ammonothermal method. In the typical semiconductor device fabrication, many devices are fabricated on one wafer followed by separation of each device by dicing, cleavage or other method. In the case that one device is fabricated from one wafer, the substrate can be a whole wafer. In one instance, the dislocation density of the group III nitride substrate is less than $10^5$ cm$^{-2}$ and electron concentration of the substrate is higher than $10^{18}$ cm$^{-3}$. In another instance the dislocation density of the substrate is less than $10^5$ cm$^{-2}$ and oxygen or silicon concentration of the substrate is higher than 1 atom per $10^{18}$ cm$^{-3}$. In this case, oxygen or silicon can be the primary donor of electrons. By taking advantage of high electron concentration of $Ga_{1-x-y}Al_xIn_yN$ ($0 \leq x \leq 1$, $0 \leq y \leq 1$) substrate by the ammonothermal growth, we can attain low on-resistance.

The group III nitride substrate may be formed by growing one or more bulk crystals of $Ga_{1-x1-y1}Al_{x1}In_{y1}N$ ($0 \leq x1 \leq 1$, $0 \leq y1 \leq 1$) using the ammonothermal method. The crystals may be grown under acidic, basic, or neutral conditions in a high-pressure reactor as known in the art or as described in any of the generally-related patent applications listed above. An electron donor such as oxygen and/or silicon is incorporated into the bulk crystal during ammonothermal growth by introducing enough oxygen and/or silicon into the growth chamber of the high-pressure reactor as nutrient, mineralizer, seed, ammonia, and any other desired materials are placed in the reactor. Oxygen can be introduced into the chamber from air by evacuating the reactor of ambient air after loading the raw materials but leaving a sufficient amount of air in the reactor to provide the desired level of oxygen in the chamber. Oxygen can also or alternatively be introduced into the reactor chamber in the form of an oxide of e.g. an element used in the mineralizer. For instance, sodium and/or potassium may be used as the mineralizer, and often the sodium and/or potassium added to the reactor has an amount that has oxidized. The oxygen from the mineralizer may provide a sufficient amount of oxygen to provide the specified level of oxygen concentration in the bulk crystal. Silicon can be introduced by e.g. adding an amount of silane gas to the reactor that results in the specified concentration of silicon in the bulk crystal or using other methods known in the art.

The high-purity, low-carrier concentration active layer may be formed by vapor phase epitaxy on the first side of the substrate so that the impurity level and the electron concentration in the active layer is low. The growth conditions of the active layer can be optimized so that no dislocations are newly generated at the interface between the substrate and the active layer. The optimization may include adjusting growth temperature, temperature ramping profile, timing of introducing reaction gas or source, or other technique as known by a person of ordinary skill. In this way, the dislocation density of the $Ga_{1-x2-y2}Al_{x2}In_{y2}N$ ($0 \leq x2 \leq 1$, $0 \leq y2 \leq 1$) active layer can be at the same level of that of the substrate (i.e. less than $10^5$ cm$^{-2}$). The dislocation density of the active layer can therefore be lower than the dislocation density for an active layer on comparable horizontal devices formed on heteroepitaxial wafers ($10^9$ cm$^{-2}$ level) (where all electrodes for an electrical device on a wafer are found on only one side or surface of the wafer and no electrodes for that device are on the opposite side of the wafer). In addition, vapor phase epitaxy can attain a lower impurity concentration than that of the ammonothermal substrate. Therefore, the electron concentration of the active layer is lower than $10^{16}$ cm$^{-3}$. The high structural quality and high purity nature of the active layer enables faster electron mobility and higher breakdown voltage.

To attain sufficient breakdown voltage, the high-purity, low-carrier concentration active layer has a sufficient thickness, for example, larger than 5 microns, or typically 10 microns.

The active layer may have a much lower concentration of sodium or other mineralizer than the group III nitride substrate. The active layer may have a concentration e.g. less than one-tenth or one-hundredth of the sodium or other mineralizer present in the substrate. The substrate may have a concentration of mineralizer such as sodium of greater than about $10^{16}$ cm$^{-3}$.

To maximize the structural quality and the purity of the active layer, a transition layer can be optionally grown on the substrate before growing the active layer. The lattice constant of a GaN or other Group III nitride substrate formed using ammonothermal growth may be slightly larger than the lattice constant of a corresponding GaN or Group III nitride substrate grown using a vapor phase method. This may be due to high concentration of impurities and/or electrons in the substrate formed by ammonothermal growth. Therefore, it can be helpful to grow a transition layer having a lattice constant matched to the substrate initially. The alloy composition of the $Ga_{1-x3-y3}Al_{x3}In_{y3}N$ ($0 \leq x3 \leq 1$, $0 \leq y3 \leq 1$) transition layer can be gradually changed to make the lattice constant of the transition layer at the surface of the transition layer that will contact the active layer suitable for the successive active layer. The composition can be changed by e.g. altering the flow rates of reactant gases during growth, so that the transition layer's crystalline structure is well-matched to the substrate on one surface of the transition layer and the active layer on an opposite surface of the transition layer. In this way, the structural quality of the active layer is maximized.

When the lattice constant or the lattice curvature of the ammonothermal substrate is too large, a $Ga_{1-x3-y3}Al_{x3}In_{y3}N$ ($0 \leq x3 \leq 1$, $0 \leq y3 \leq 1$) transition layer grown by vapor phase epitaxy sometimes cracks. However these cracks can be buried by further growing the material by changing growth temperature, temperature ramping profile, and/or timing of introducing reaction gas or source to increase growth and fill in the cracks based on observations during layer growth or from observations of transition layers formed during previous runs. The active layer can be grown after all cracking damages are healed.

The transition layer can also be used to prevent potential diffusion of impurity from the Group III nitride substrate into the active layer. In particular, sodium in the substrate can diffuse into the active layer during the fabrication process or device operation. An appropriate dopant such as silicon and magnesium in the transition layer may block such diffusion.

Instead of using a Group III nitride substrate having a transition layer, one can use a template-type wafer as disclosed in US 2006/0057749 A1, the contents of which are incorporated by reference in their entirety as if put forth in full below. The purpose of a template is to maintain the crystal quality (i.e. dislocation/defect density) of the wafer during epitaxial growth of the high-purity, low-carrier concentration active layer.

It is worth noting that the transition layer can be a portion of the active layer. If the active layer is grown in two or more steps by, e.g., changing growth temperature, pressure, and/or flow rate of reactants, the part of the active layer closer to the substrate will have a lattice constant that more closely matches the substrate's lattice constant so that part of the active layer acts as a transition layer.

The device has a depletion region in the active layer. A structure such as a Schottky contact, metal insulator semiconductor structure, or p-n junction depletes charge carriers from the depletion region in the active layer so that the device functions as an electronic device. The structure can be a Schottky contact, metal-insulator-semiconductor structure or p-n junction. In any case, formation of such structure requires that the surface of the semiconductor active layer has high quality. When a Schottky contact is made on the active layer and one ohmic contact is made on the backside of the substrate, the device can work as a Schottky diode. If an additional ohmic contact is made on the active layer with a current blocking region and a low-resistance contact region, the device can be a metal-semiconductor field effect transistor (MESFET). The Schottky contact of the MESFET can be replace with a metal-insulator-semiconductor structure. When p-type semiconductor is formed on the active layer, the device can be a p-n diode. With an additional n-type semiconductor on the p-type semiconductor, the device can be a bipolar transistor. One can use heterojunction for these n-p-n structure (hetero bipolar transistor: HBT). Since all of these devices have a vertical configuration, they are suitable for high-current operation.

Technical Description of the Invention

Some example structures of the electronic devices in this invention are explained by using the drawings. FIG. 1 shows one example of an electronic device. This device has a $Ga_{1-x1-y1}Al_{x1}In_{y1}N$ ($0 \leq x1 \leq 1$, $0 \leq y1 \leq 1$) substrate 2 made by ammonothermal growth and a $Ga_{1-x2-y2}Al_{x2}In_{y2}N$ ($0 \leq x2 \leq 1$, $0 \leq y2 \leq 1$) active layer 3 grown on one side of the substrate by vapor phase epitaxy. A typical vapor phase epitaxy such as metalorganic chemical vapor deposition (MOCVD), HVPE, and/or molecular beam epitaxy (MBE) can be used to deposit the active layer. An ohmic contact is formed on the other side of the substrate by depositing e.g. a Ti/Al layer 1, and a Schottky contact 4 is formed on part of the active layer by evaporating and depositing a metal or metals. The shape of the Schottky contact can be round, square, rectangular, or other polygon such as a triangle, pentagon, or hexagon. The Schottky contact can be a few hundred microns in size, for example, depending on the current rating of the device. If higher current is required, the contact can be a few millimeters or even larger. This device is configured as a Schottky diode.

The Schottky contact can be replaced with p-type $Ga_{1-x4-y4}Al_{x4}In_{y4}N$ ($0 \leq x4 \leq 1$, $0 \leq y4 \leq 1$) having an ohmic contact on top of the p-type layer. In this case the device can function as a p-n diode. If the ohmic contact of this p-n diode is replaced with a n-type $Ga_{1-x5-y5}Al_{x5}In_{y5}N$ ($0 \leq x5 \leq 1$, $0 \leq y5 \leq 1$), the device can function as bipolar transistor. If the active layer, p-type layer and the n-type layer have different alloy compositions, the device can function as a hetero bipolar transistor (HBT). For example, the active layer can be undoped GaN, the p-type layer can be p-GaN, and the top n-type layer can be n-AlGaN with aluminum content of e.g. 10%. For forming additional $Ga_{1-x-y}Al_xIn_yN$ ($0 \leq x \leq 1$, $0 \leq y \leq 1$) layers, MOCVD, HVPE, MBE or other vapor phase method can be used. Schottky and ohmic contacts can be formed with metal evaporation, sputtering or other typical metallization used in the semiconductor processing.

Figure 2:
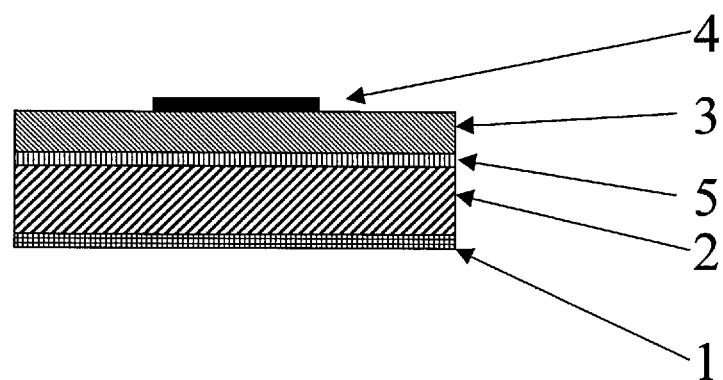
FIG. 2 is one example of electronic device using group III nitride.

FIG. 2 shows one example of an electronic device. In addition to the layers 1-4 shown in FIG. 1, this device has a transition layer 5 of $Ga_{1-x-y}Al_xIn_yN$ ($0 \leq x \leq 1$, $0 \leq y \leq 1$) between the substrate and the active layer. The purpose of this transition layer is to realize the highest structural quality and purity in the active layer. Both the transition layer and the active layer are grown by a vapor phase method, but different methods can be used to grow each layer. For example, the transition layer can be grown by HVPE and the active layer can be grown by MOCVD. In this combination, it is easy to grow thick enough transition layer due to much faster growth rate of HVPE than MOCVD. On the other hand, the opposite combination can also be used, i.e. growing the transition layer with MOCVD and the active layer with HVPE. In this case, precise control of lattice constant and/or impurity concentration is possible due to slower growth rate of MOCVD. Instead of using MOCVD, MBE can also be utilized. As explained above, the alloy composition or impurity concentration of the transition layer can be optimized to maximize the structural quality and purity of the active layer. For example, the transition layer of InGaN with gradually changing indium composition can be grown with MBE to gradually change the lattice constant along the growth direction. Also, doping level of Si in the GaN transition layer can be gradually changed with MBE to gradually narrow the lattice constant along the growth direction.

Figure 3:
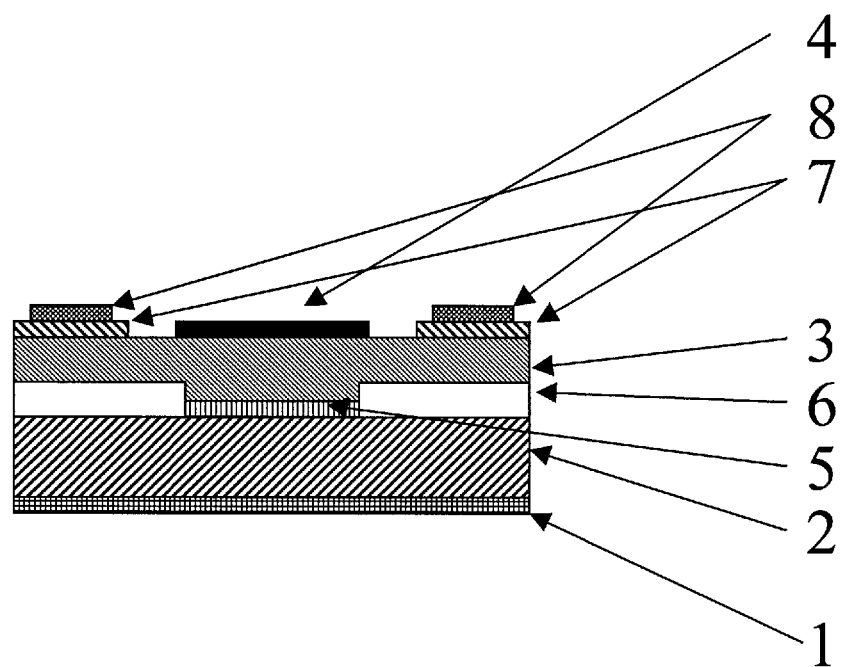
FIG. 3 is one example of electronic device using group III nitride.
In the figure each number represents the following:
 1. Back ohmic contact
 2. Substrate
 3. High-purity, low-carrier concentration active layer
 4. Schottky contact
 5. Transition layer
 6. Current blocking layer
 7. Regions of high electron concentration
 8. Front ohmic contact

FIG. 3 shows one example of an electronic device having three terminals (note that FIG. 3 shows two sets of the regions of high electron concentration 7 and the front ohmic contact 8 but these sets are connected together). Other layers are as labeled in FIG. 2. To make this device function as a transistor, an appropriate current blocking layer 6 is inserted. The current blocking layer 6 limits the current path to be primarily beneath the Schottky contact 4. The current blocking layer 6 can be an insulator such as silicon dioxide or an insulating gas such as air. Also, the current blocking layer 6 can be p-type or semi-insulating semiconductor such as p-GaN, p-AlGaN or semi-insulating GaN. The Schottky contact 4 creates a depletion region inside the active layer 3. Since the size of the depletion region can be changed by applied voltage to the Schottky contact 4, current flow between the back ohmic contact 1 and the front ohmic contact 8 can be regulated. If the depletion region reaches the current blocking layer, the current is shut off. Depending on the device parameters such as thickness and carrier concentration of the active layer 3, the device can operate normally-off or normally-on mode. In normally-off mode, the current through the two ohmic contacts is zero with zero voltage on the Schottky contact 4.

The Schottky contact can be replaced with metal-insulator-semiconductor structure. In this case, an appropriate insulator such as $SiO_2$, $Al_2O_3$, AlN may be used. The device can operate as MISFET.

The insulator layer thickness and properties such as composition and resistance can be adjusted. The current blocking layer can optionally be formed on the transition layer.

Figure 4:
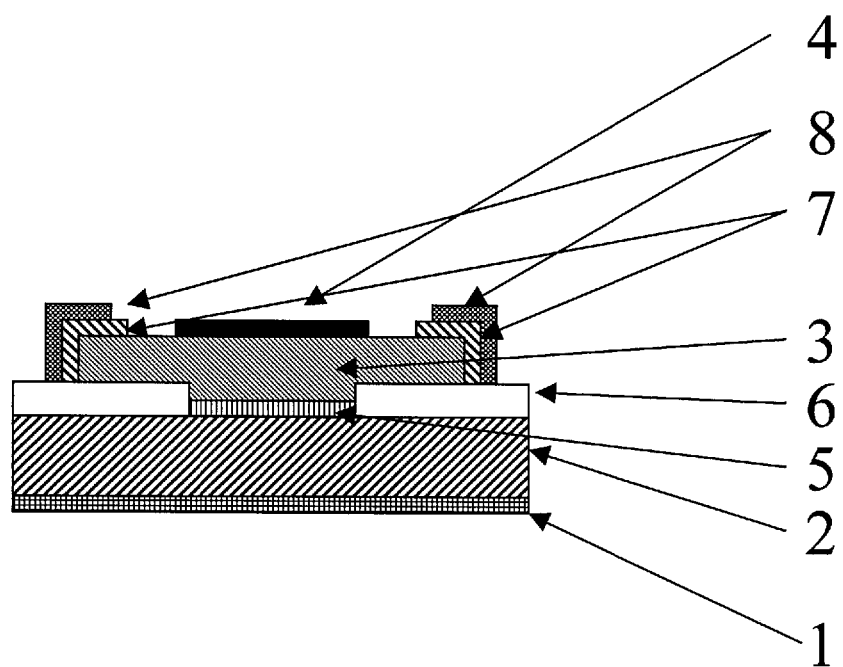
FIG. 4 is one example of electronic device using group III nitride.
In the figure each number represents the following:
 1. Back ohmic contact
 2. Substrate
 3. High-purity, low-carrier concentration active layer
 4. Schottky contact
 5. Transition layer
 6. Current blocking layer
 7. Regions of high electron concentration
 8. Front ohmic contact

FIG. 4 shows one example of an electronic device having the same set of layers for the device of FIG. 3. If a selective growth technique such as laser-assisted epitaxy, migration-enhanced epitaxy, foreign body inclusion, and/or step edge inclusion is used to grow the transition layer 5 and the active layer 3, the active layer 3 sometimes does not form a continuous film (as discussed in more detail below). In such case the device can have the structure illustrated in FIG. 4.

Figure 5:
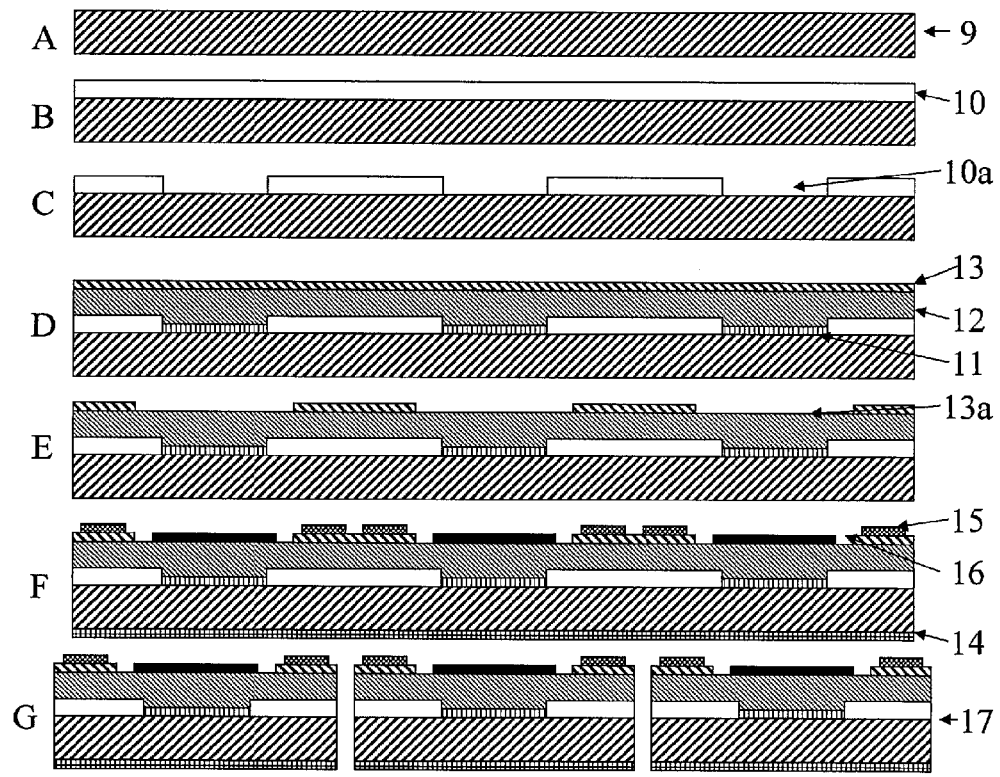
FIG. 5A through 5G is one example of fabrication process of electronic device using group III nitride.
In the figure each number represents the following:
 9. Substrate of $Ga_{1-x-y}Al_xIn_yN$ ($0 \leq x \leq 1$, $0 \leq y \leq 1$) sliced from a bulk crystal of $Ga_{1-x-y}Al_xIn_yN$ ($0 \leq x \leq 1$, $0 \leq y \leq 1$) grown in supercritical ammonia
 10. A current blocking layer
 10a. A hole of the current blocking layer
 11. A transition layer grown in the hole of the current blocking layer
 12. A high-purity, low-carrier concentration active layer
 13. A layer with high electron concentration
 13a. A window in the layer with high electron concentration
 14. Back ohmic contact
 15. Front ohmic contact
 16. Schottky contact
 17. An individual electronic device after die cut

One example of the fabrication process of an electronic device in FIG. 3 is presented in FIG. 5A through FIG. 5G. First, a substrate of $Ga_{1-x-y}Al_xIn_yN$ ($0 \leq x \leq 1$, $0 \leq y \leq 1$) sliced from a bulk crystal of $Ga_{1-x-y}Al_xIn_yN$ ($0 \leq x \leq 1$, $0 \leq y \leq 1$) grown in supercritical ammonia 9 is prepared (FIG. 5A). The first surface which the active layer is grown on is preferably polished by chemical mechanical polishing (CMP) to achieve atomically flat surface. The surface can also be miscut up to 5 degree to maximize the crystallinity of the active layer. A current blocking layer 10 is formed on the first surface of the substrate (FIG. 5B). Using a lithography technique commonly used in semiconductor process, holes 10a in the current blocking layer are formed (FIG. 5C). If silicon dioxide is used as the current blocking layer, wet etching with hydrofluoric acid can be used after appropriate patterning with photo resist. If semiconductor layer is used as the current blocking layer, dry etching such as reactive ion etching can be used. In either case, appropriate treatment of the exposed substrate surface is preferably taken to ensure epitaxial growth of the active layer and/or the transition layer. Then, a transition layer 11 is grown on the substrate followed by growth of the active layer 12. In addition, a layer with high electron concentration 13 such as Si-doped GaN is grown at the same time (FIG. 5D) in this example. These layers can be grown in the same vapor phase method such as MOCVD, HVPE, or MBE. Also, different vapor phase methods can be used for each layer. Using photo resist patterning and dry etching commonly used in the semiconductor process, windows 13a on the layer with high electron concentration are formed (FIG. 5E). Using standard semiconductor metallization process, the back ohmic contact 14 such as Ti/Al and front ohmic contact 15 such as Ti/Al are formed. These contacts are preferably annealed to ensure ohmic characteristics of the contacts. The Schottky contact 16 are formed after an appropriate treatment of the exposed surface of the active layer such as etching with hydrofluoric acid for 5 minutes followed by rinse in de-ionized water (FIG. 5F). Finally, using a wafer dicer, individual devices 17 are cut out from the epitaxial multi-layer wafer (FIG. 5G).

Figure 6:
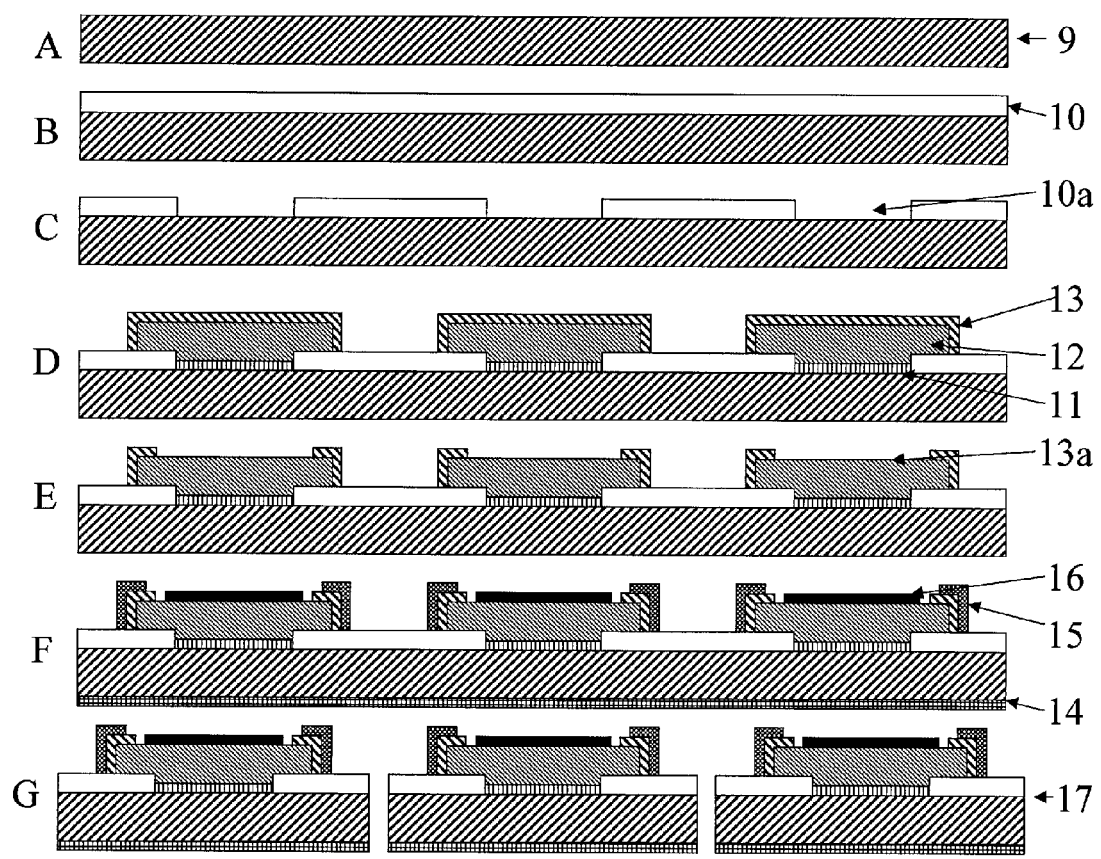
FIG. 6A through 6G is one example of fabrication process of electronic device using group III nitride.
In the figure each number represents the following:
 9. Substrate of $Ga_{1-x-y}Al_xIn_yN$ ($0 \leq x \leq 1$, $0 \leq y \leq 1$) sliced from a bulk crystal of $Ga_{1-x-y}Al_xIn_yN$ ($0 \leq x \leq 1$, $0 \leq y \leq 1$) grown in supercritical ammonia
 10. A current blocking layer
 10a. A hole of the current blocking layer
 11. A transition layer grown in the hole of the current blocking layer
 12. A high-purity, low-carrier concentration active layer
 13. A layer with high electron concentration
 13a. A window in the layer with high electron concentration
 14. Back ohmic contact
 15. Front ohmic contact
 16. Schottky contact
 17. An individual electronic device after die cut

FIG. 6 shows one example of fabrication process of an electronic device that has layers as discussed above for FIG. 5. Similar to the above example in FIG. 5, the current blocking layer with holes is fabricated on the ammonothermal substrate. In this case, the current blocking layer is preferably silicon dioxide or other dielectric material to ensure selective growth of the active layer 12 and/or the transition layer 11. A transition layer of $Ga_{1-x-y}Al_xIn_yN$ ($0 \leq x \leq 1$, $0 \leq y \leq 1$) 11 can be grown selectively on the exposed surface of the substrate 9. This means that the dielectric current blocking layer 10 works as a mask for growth of $Ga_{1-x-y}Al_xIn_yN$ ($0 \leq x \leq 1$, $0 \leq y \leq 1$). Once the height of the transition layer 11 or the active layer 12 exceeds the height of the current blocking layer, $Ga_{1-x-y}Al_xIn_yN$ ($0 \leq x \leq 1$, $0 \leq y \leq 1$) starts to grow laterally over the current blocking layer 10 until the lateral growth front of the $Ga_{1-x-y}Al_xIn_yN$ ($0 \leq x \leq 1$, $0 \leq y \leq 1$) reaches the growth front of the adjacent devices. If growth is stopped before coalescence, the epitaxial multi-layer wafer structure becomes one shown in FIG. 6D. Then, a layer having high electron concentration 13 is patterned to open windows 13a to the active layer (FIG. 6E), and each contact 14, 15, 16 is formed (FIG. 6F) in a process similar to the process described for FIG. 5. After wafer dicing, an electronic device 17 in FIG. 6G or FIG. 4 is completed. With this selective growth technique of keeping the active layer from coalescing, stress in the transition layer and/or the active layer can be reduced, and device performance can be improved.

Example 1

Bulk crystals of GaN were grown with the basic ammonothermal method in a pressure reactor having internal volume of 127 cc using polycrystalline GaN (15 g) as a nutrient, supercritical ammonia (53% fill to the reactor volume) as a solvent, sodium (5 mol % to ammonia) as a mineralizer. The growth temperature was between 500 to 600° C. and the growth was extended to 181 days. Bulk crystal of GaN was grown on a c-plane GaN seed crystals. The size of the crystal was approximately 10 mm². Then the crystal was sliced into substrates using a multiple wire saw. Nine substrates were sliced out of one bulk GaN crystal. These substrates were lapped with diamond slurry and polished using CMP. The defect density of one of these substrates was characterized with X-ray topography. The dislocation density was $4 \times 10^4$ cm$^{-2}$. The oxygen concentration was $3.2 \times 10^{19}$ cm$^{-3}$. From the oxygen concentration, the electron concentration is estimated to be mid to high-$10^{18}$ cm$^{-3}$ range.

Using a pressure reactor having a similar internal volume, bulk GaN crystals can be grown in the similar conditions of polycrystalline GaN nutrient (1~500 g), ammonia (30~60% fill), and sodium (1-10% to ammonia). The bulk GaN crystals grown is this way typically shows n-type conductivity with electron concentration higher than $10^{18}$ cm$^{-3}$.

Example 2

Using GaN substrates prepared by ammonothermal growth, GaN layers were grown by HVPE. The obtained epitaxial multi-layer wafer can be used to fabricate the electron devices as presented in Examples 3 and 4. In each run, one substrate of approximately 10 mm×10 mm in size was used. Inside the HVPE reactor, hydrogen chloride gas was passed over heated Ga, and the resultant gallium chloride then mixed with ammonia and subsequently contacted the heated substrate. The temperature of the Ga was in the range of 800 to 1000° C. and the temperature of the substrate was in the range of 900 to 1150° C. In this example, GaN having thickness of 11 microns, 24 microns, 56 microns, and 164 microns were grown on the Ga-polar surface of the ammonothermal c-plane GaN substrates. The growth rate was in the range of 50 to 400 microns per hour. The surface of the 11 micron-thick GaN film had cracks originating from the interface between the ammonothermal substrate and the HVPE film; however, the other three films did not have cracks in their surfaces. This confirmed that cracks originating from the interface between the ammonothermal substrate and the active layer formed by HVPE can be buried by growing a thicker layer.

For the 56 micron-thick film, a transition layer of GaN was grown for 4 minutes before growing the active layer for 5 minutes. The growth temperature for the transition layer was approximately 100 degree lower than that of the active layer. Also in this case, the top surface of the active layer was crack-free and showed high quality surface.

The carrier concentration of the active layers for 24 micron, 56 micron and 164 micron-thick film was less than $10^{16}$ cm$^{-2}$, representing high-purity and low-carrier concentration feature.

Using other vapor phase method such as MOCVD and MBE for growing the transition layer and/or the active layer should have the same benefit of the crack reduction presented in this example.

Although a transition layer is optional, a device preferably has a separate transition layer with e.g. composition and/or impurity concentration varied from one face of the layer to the other in order to provide a surface matched to the active layer to maximize its crystallinity and purity.

Example 3

Using the epitaxial multi-layer wafer having a GaN high-purity, low-carrier concentration active layer, a Schottky diode can be fabricated by forming a ohmic contact of aluminum on the back side of the wafer and Schottky contact of Ni on the surface of the active layer. First, the wafer with the active layer is cleaned in hydrofluoric acid to remove surface oxide. Then, approximately 1 micron of nickel is evaporated on the surface of the active layer. Patterning of photo resist is performed using a standard semiconductor process and nickel is etched with nitric acid. Then, the photo resist is removed with acetone. After forming the Schottky contact, approximately 1 micron of Ti/Al ohmic contact is evaporated on the back side of the wafer. Then each device is separated with wafer dicer.

This structure has a benefit of low on-resistance due to high electrical conductivity (higher than $10^{18}$ cm$^{-3}$) of the substrate and high break down voltage due to high resistivity of the active layer. The high resistivity of the active layer is achieved by low carrier concentration less than $10^{16}$ cm$^{-3}$. Combination of vapor phase growth with ammonothermal GaN substrate is beneficial to achieve both low on-resistance and high breakdown voltage. Also, optional transition layer by the vapor phase growth can achieve higher performance by ensuring high crystallinity and purity of the active layer.

Example 4

By growing an additional layer of p-type GaN by a vapor phase epitaxy, followed by forming an ohmic contact of Ni/Au, a p-n diode can be fabricated using the epitaxial multi-layer wafer having a GaN high-purity, low-carrier concentration active layer. The thickness of the p-type GaN can be more than 0.1 micron. The thickness of Ni/Au is approximately 1 micron. The back ohmic contact is formed as discussed in Example 3. The device can operate as a p-n diode.

Example 5

The process in Example 3 can be incorporated in a process to fabricate MESFET. In addition to the two electrodes (one ohmic back drain contact and one Schottky gate contact), MESFET has one more ohmic source contact next to the Schottky gate contact. Since the active layer has low concentration of electrons, an appropriate highly doped contact region is used to ensure low contact resistance of the ohmic source contact. To attain this structure, additional layer of GaN with high-electron concentration is grown on the active layer followed by reactive ion etching to make a window for the Schottky gate contact. 1 micron-thick Ti/Al ohmic contacts are used for the source and drain contacts.

With an appropriate device design such as the distance of the current blocking layer to the Schottky gate contact, the MESFET can operate normally off mode. This is achieved by reducing the electron concentration of the active layer as well as reducing the distance of the current blocking layer to the Schottky gate contact so that the depletion region created by the Schottky barrier closes the current channel between the gate and the current blocking layer. By changing the applied voltage to the gate, we can control the channel width, thus control the amount of current through the source contact and the drain contact. The active layer and/or transition layer alone or together preferably has a thickness sufficiently large that the depletion region does not reach the ammonothermal substrate or damaged (i.e. cracked region) at the interface between the substrate and the transition/active layer under appropriate bias condition for the gate contact.

The Schottky gate contact can be replaced with a metal-insulator-semiconductor structure. In such case, insulator layer of $SiO_2$, $Al_2O_3$ or AN is deposited on the active layer with a sputtering. Then Ti/Al contact is evaporated on the insulator layer with appropriate patterning. The device can operate as MISFET.

Example 6

By additionally growing n-GaN or n-AlGaN on the p-n diode in Example 4, the device can operate as bipolar transistor or hetero bipolar transistor (HBT). In this case, the p-type $Ga_{1-x-y}Al_xIn_yN$ (0≤x≤1, 0≤y≤1) layer must be thinner than other layers. The growth of these layers is conducted with MOCVD, MBE, HVPE or other vapor phase method. Ni/Au can be used for p-type contact and Ti/Al can be used for n-type contact.

Possible Modifications

Although the preferred embodiment describes GaN substrates, the substrate can be group III nitride alloys of various composition, such as AN, AlGaN, InN, InGaN, or GaAlInN The scope of the invention is maintained with these substrates.

Although the preferred embodiment describes Ga-face c-plane GaN, other orientations such as N-face c-plane, a-face, m-face, and various semipolar surface can also be used. In addition, the surface can be slightly miscut (off-sliced) from these orientations. The scope of the invention is maintained with these orientations and miscut. In particular, usage of N-face c-plane GaN, nonpolar a-face and m-face, semipolar planes will modulate the energy band structure of the electronic devices, thus can control the turn-on voltage of the MESFET or MISFET.

Although the preferred embodiment utilizes HVPE, other methods such as MOCVD, MBE, reactive sputtering, ion-beam deposition can be used to grow the active layer and/or the transition layer in this invention.

Although the preferred embodiment uses Ni for Schottky contact and Ti/Al for ohmic contact, other metals can also be used. Examples for Schottky contact is Pt, Pd, Co, Au, Mg, and examples for ohmic contacts is Cr, In, Ag.

Further examples of the invention include the subject matter laid out in the following paragraphs, which are provided by way of example and which do not, of course, limit the scope of the invention:

1. An epitaxial multi-layer wafer for fabricating electronic devices comprising (i) a group III nitride substrate of $Ga_{1-x1-y1}Al_{x1}In_{y1}N$ (0≤x1≤1, 0≤y1≤1) having a first side and a second side opposite to the first side and (ii) an active layer of $Ga_{1-x2-y2}Al_{x2}In_{y2}N$ (0≤x2≤1, 0≤y2≤1) on the first side of the group III nitride substrate, wherein:

(a) a dislocation density of the group III nitride substrate is less than $10^5$ cm$^{-2}$;

(b) the group III nitride substrate has an electron concentration higher than $10^{18}$ cm$^{-3}$;

(c) the group III nitride substrate is fabricated from a bulk crystal of $Ga_{1-x1-y1}Al_{x1}In_{y1}N$ (0≤x1≤1, 0≤y1≤1) grown in supercritical ammonia;

(d) the active layer is an epitaxially deposited layer which has an electron concentration lower than $10^{18}$ cm$^{-3}$;

(e) the active layer has a thickness sufficiently large that a depletion region which is formed in the active layer after fabricating the electronic device with a first electrode on the first side of the wafer and a second electrode on the second side of the wafer is outside of the substrate.

2. An epitaxial multi-layer wafer according to paragraph 1 wherein the active layer has an electron concentration lower than $10^{16}$ cm$^{-3}$.

3. An epitaxial multi-layer wafer for fabricating electronic devices comprising (i) a group III nitride substrate of $Ga_{1-x1-y1}Al_{x1}In_{y1}N$ ($0\leq x1\leq 1$, $0\leq y1\leq 1$) having a first side and a second side opposite to the first side and (ii) an active layer of $Ga_{1-x2-y2}Al_{x2}In_{y2}N$ ($0\leq x2\leq 1$, $0\leq y2\leq 1$) on the first side of the group III nitride substrate, wherein:

(a) a dislocation density of the group III nitride substrate is less than $10^5$ cm$^{-2}$;

(b) the group III nitride substrate has an electron concentration higher than $10^{18}$ cm$^{-3}$;

(c) the group III nitride substrate is fabricated from a bulk crystal of $Ga_{1-x1-y1}Al_{x1}In_{y1}N$ ($0\leq x1\leq 1$, $0\leq y1\leq 1$) grown in supercritical ammonia;

(d) the active layer is an epitaxially deposited layer which has an oxygen concentration lower than $10^{18}$ cm$^{-3}$;

(e) the active layer has a thickness sufficiently large that a depletion region which is formed in the active layer after fabricating the electronic device with a first electrode on the first side of the wafer and a second electrode on the second side of the wafer is outside of the substrate.

4. An epitaxial multi-layer wafer according to paragraph 3 wherein the active layer has an oxygen concentration lower than $10^{16}$ cm$^{-3}$.

5. An epitaxial multi-layer wafer according to any of paragraphs 1-4 wherein the thickness of the active layer is more than 5 microns.

6. An epitaxial multi-layer wafer according to any of paragraphs 1-5 and further comprising a transition layer of $Ga_{1-x3-y3}Al_{x3}In_{y3}N$ ($0\leq x3\leq 1$, $0\leq y3\leq 1$) between the substrate and the active layer, wherein a first side of the transition layer has a crystal lattice matched to a crystal lattice of the first side of the substrate, and wherein a second side of the transition layer has a crystal lattice matched to a crystal lattice of a first side of the active layer. the lattice constant of the transition layer varies along the growth direction so that the lattice matching is realized at the interface between the substrate and the transition layer and at the interface between the transition layer and the active layer.

7. An epitaxial multi-layer wafer according to paragraph 6 wherein the transition layer is grown by a vapor phase epitaxy.

8. An epitaxial multi-layer wafer according to paragraph 6 or paragraph 7 wherein the transition layer is thick enough to bury cracks created at the interface between the substrate and the transition layer.

9. An epitaxial multi-layer wafer according to any of paragraphs 6-8 wherein the depletion zone extends into the transition layer.

10. An epitaxial multi-layer wafer according to any of paragraphs 6-8 wherein the active layer is thicker than the depletion zone.

11. An epitaxial multi-layer wafer according to any of paragraphs 6-10 wherein the transition layer is doped with an impurity which prevents diffusion of impurities contained in the substrate.

12. An epitaxial multi-layer wafer according to any of paragraphs 1-11 and further comprising a current blocking layer between the group III nitride substrate and the active layer.

13. An epitaxial multi-layer wafer according to any of paragraphs 1-12 wherein the active layer has a dislocation density less than $10^5$ cm$^{-2}$.

14. An epitaxial multi-layer wafer according to any of paragraphs 1-13 wherein the substrate has a sodium concentration of greater than $10^{16}$ cm$^{-3}$ and the active layer contains at least 100 times less sodium than the substrate.

15. An epitaxial multi-layer wafer according to any of paragraphs 1-14 wherein the substrate is a c plane with miscut more than 0.1 degree and less than 5 degree.

16. An electronic device comprising a multi-layer wafer according to any of paragraphs 1-15 and said electrodes which form the depletion region outside of the group III nitride wafer over an operating range of the electronic device.

17. A method of making a multi-layer wafer comprising epitaxially depositing from vapor phase, upon a first side of a substrate of $Ga_{1-x1-y1}Al_{x1}In_{y1}N$ ($0\leq x1\leq 1$, $0\leq y1\leq 1$) formed by an ammonothermal method and having a second side opposite to the first side, an active layer of $Ga_{1-x2-y2}Al_{x2}In_{y2}N$ ($0\leq x2\leq 1$, $0\leq y2\leq 1$), wherein the active layer has a thickness sufficiently large that a depletion region which is formed in the active layer after fabricating an electronic device with a first electrode on the first side of the wafer and a second electrode on the second side of the wafer is outside of the substrate, wherein the substrate has an oxygen concentration of greater than $10^{18}$ cm$^{-3}$ and the vapor phase has a sufficiently low concentration of oxygen to provide an oxygen concentration in the active layer of less than $10^{18}$ cm$^{-3}$.

18. A method according to paragraph 17 wherein the vapor phase has a sufficiently low concentration of oxygen to provide an oxygen concentration in the active layer of less than $10^{16}$ cm$^{-3}$.

19. A method of making a multi-layer wafer comprising epitaxially depositing from vapor phase, upon a first side of a substrate of $Ga_{1-x1-y1}Al_{x1}In_{y1}N$ ($0\leq x1\leq 1$, $0\leq y1\leq 1$) formed by an ammonothermal method and having a second side opposite to the first side, an active layer of $Ga_{1-x2-y2}Al_{x2}In_{y2}N$ ($0\leq x2\leq 1$, $0\leq y2\leq 1$), wherein the active layer has a thickness sufficiently large that a depletion region which is formed in the active layer after fabricating an electronic device with a first electrode on the first side of the wafer and a second electrode on the second side of the wafer is outside of the substrate, wherein the substrate has an oxygen concentration of greater than $10^{18}$ cm$^{-3}$ and the active layer has a sufficiently low concentration of an electron donor to provide an electron concentration in the active layer of less than $10^{18}$ cm$^{-3}$.

20. A method according to paragraph 19 wherein the active layer has a sufficiently low concentration of electron donor to provide an electron concentration in the active layer of less than $10^{16}$ cm$^{-3}$.

21. A method according to any of paragraphs 17-20 wherein the active layer is deposited to a thickness of at least about 5 microns.

22. A method according to any of paragraphs 17-21 and further comprising epitaxially depositing a transition layer of $Ga_{1-x3-y3}Al_{x3}In_{y3}N$ ($0\leq x3\leq 1$, $0\leq y3\leq 1$) while varying a concentration of a reactant and/or deposition conditions so that a first face of the transition layer matches a crystal lattice of the first side of the substrate during the depositing and a second, opposite face of the transition layer matches a crystal lattice of a first side of the active layer upon completion of depositing the transition layer.

23. A method according to paragraph 22 wherein the transition layer cracks during said depositing, and wherein the method further comprises depositing an additional amount of the transition layer to bury the transition layer cracks so that the second surface of the transition layer has no cracks.

24. A method according to paragraph 22 or paragraph 23 wherein the active layer is deposited to a thickness such that the depletion zone extends into a portion of the transition layer.

25. A method according to paragraph 24 wherein the depletion zone ends before reaching cracks in the transition layer.

26. A method according to any of paragraphs 22-25 wherein the transition layer is doped with an impurity which prevents diffusion of impurities contained in the substrate.

27. A method according to any of paragraphs 17-26 and further comprising depositing a current blocking layer between the group III nitride substrate and the active layer.

28. A method according to any of paragraphs 17-27 wherein the active layer has a sufficiently low concentration of sodium that the active layer contains at least 100 times less sodium than the substrate, and the substrate contains sodium at a concentration greater than $10^{16}$ cm$^{-3}$.

29. A method according to any of paragraphs 17-28 wherein said first side of the substrate is miscut more than 0.1 degree and less than 5 degree to a c plane.

30. A method according to any of paragraphs 17-29 and further comprising providing said electrodes.

31. An electronic device comprising a substrate of $Ga_{1-x1-y1}Al_{x1}In_{y1}N$ ($0 \leq x1 \leq 1$, $0 \leq y1 \leq 1$), an active layer of $Ga_{1-x2-y2}Al_{x2}In_{y2}N$ ($0 \leq x2 \leq 1$, $0 \leq y2 \leq 1$) on a first side of the substrate, a back ohmic contact on a second side opposite to the first side of the substrate, and a depletion region having a depth in the active layer, wherein;
   (a) the substrate has a dislocation density of less than $10^5$ cm$^{-2}$;
   (b) the substrate has an electron concentration greater than $10^{18}$ cm$^{-3}$;
   (c) the active layer has an electron concentration of less than $10^{18}$ cm$^{-3}$;
   (d) the active layer has a thickness greater than the depth of the depletion region for any applied voltage within an operation range of the device.

32. An electronic device according to paragraph 31 wherein the electron concentration of the active layer is less than $10^{16}$ cm$^{-3}$.

33. An electronic device comprising a substrate of $Ga_{1-x1-y1}Al_{x1}In_{y1}N$ ($0 \leq x1 \leq 1$, $0 \leq y1 \leq 1$), an active layer of $Ga_{1-x2-y2}Al_{x2}In_{y2}N$ ($0 \leq x2 \leq 1$, $0 \leq y2 \leq 1$) on a first side of the substrate, a back ohmic contact on a second side opposite to the first side of the substrate, a depletion region in the active layer and having a depth, wherein;
   (a) the substrate has a dislocation density of less than $10^5$ cm$^{-2}$;
   (b) the substrate has an oxygen concentration greater than $10^{18}$ cm$^{-3}$;
   (c) the active layer has an oxygen concentration of less than $10^{18}$ cm$^{-3}$;
   (d) the active layer has a thickness greater than the depth of the depletion region for any applied voltage within an operation range of the device.

34. An electronic device according to paragraph 33 wherein the oxygen concentration of the active layer is less than $10^{16}$ cm$^{-3}$.

35. An electronic device according to any of paragraphs 31-34 further comprising a transition layer of $Ga_{1-x3-y3}Al_{x3}In_{y3}N$ ($0 \leq x3 \leq 1$, $0 \leq y3 \leq 1$) between the substrate and the active layer, wherein the transition layer is grown by vapor phase epitaxy.

36. An electronic device comprising a substrate of $Ga_{1-x1-y1}Al_{x1}In_{y1}N$ ($0 \leq x1 \leq 1$, $0 \leq y1 \leq 1$), an active layer of $Ga_{1-x2-y2}Al_{x2}In_{y2}N$ ($0 \leq x2 \leq 1$, $0 \leq y2 \leq 1$) on a first side of the substrate, a back ohmic contact on a second side opposite to the first side of the substrate, a depletion region in the active layer and having a depth, and a transition layer of $Ga_{1-x3-y3}Al_{x3}In_{y3}N$ ($0 \leq x3 \leq 1$, $0 \leq y3 \leq 1$), wherein;
   (a) the substrate has a dislocation density of less than $10^5$ cm$^{-2}$;
   (b) the substrate has an oxygen concentration or electron concentration greater than $10^{18}$ cm$^{-3}$;
   (c) the active layer has an oxygen concentration or electron concentration lower than $10^{18}$ cm$^{-3}$;
   (d) the active layer and the transition layer have a combined thickness that is greater than the depth of the depletion region for any applied voltage within the operation range of the device.

37. An electronic device according to paragraph 36 wherein the oxygen concentration of the active layer is less than $10^{16}$ cm$^{-3}$.

38. An electronic device according to paragraph 36 or paragraph 37 wherein the electron concentration of the active layer is less than $10^{16}$ cm$^{-3}$.

39. An electronic device according to any of paragraphs 36-38 wherein the active layer is thicker than the depth of the depletion region.

40. An electronic device according to any of paragraphs 36-38 wherein the depletion region extends into the transition layer.

41. An electronic device according to any of paragraphs 35-40 wherein the transition layer has a impurity concentration or alloy composition that varies along a growth direction so that lattice matching is realized at an interface between the substrate and the transition layer and at an interface between the transition layer and the active layer.

42. An electronic device according to paragraph 35-41 wherein the transition layer is sufficiently thick to bury cracks created at an interface between the substrate and the transition layer.

43. An electronic device according to paragraph 35-42 wherein the transition layer is doped with an impurity which prevents diffusion of impurities contained in the substrate.

44. An electronic device according to any of paragraphs 31-43 wherein the substrate is made of a wafer fabricated from a bulk crystal of $Ga_{1-x1-y1}Al_{x1}In_{y1}N$ ($0 \leq x1 \leq 1$, $0 \leq y1 \leq 1$) grown in supercritical ammonia.

45. An electronic device according to any of paragraphs 31-44 wherein the substrate contains sodium at a concentration of greater than about $10^{16}$ cm$^{-3}$ and the active layer has a sodium concentration at least 100 times less than the substrate.

46. An electronic device according to any of paragraphs 31-45 wherein the active layer is grown by vapor phase epitaxy.

47. An electronic device according to any of paragraphs 31-46 wherein the wafer is a c plane wafer with miscut more than 0.1 degree and less than 5 degree.

48. An electronic device according to any of paragraphs 31-47 wherein the depletion region has an adjacent Schottky contact or an adjacent p-n junction.

49. An electronic device according to any of paragraphs 31-47 wherein the depletion region has a Schottky contact or a metal-insulator-semiconductor structure and further comprising:
   (a) a current blocking layer between the substrate and the active layer, wherein the current blocking layer has an opening for an electrical current;
   (b) a front ohmic contact adjacent to the Schottky contact or the metal-insulator-semiconductor structure;
      and wherein the front ohmic contact and the Schottky contact or the metal-insulator-semiconductor structure are positioned to regulate an electric current through the front ohmic contact to the back ohmic contact with a voltage applied across the front ohmic contact and the Schottky contact.

50. An electronic device according to paragraph 49 wherein the current blocking layer comprises silicon dioxide.

51. An electronic device according to paragraph 49 wherein the current blocking layer comprises a gas.

52. An electronic device according to paragraph 51 wherein the gas is air.

53. An electronic device according to paragraph 49 wherein the current blocking layer comprises p-type or semi-insulating $Ga_{1-x-y}Al_xIn_yN$ ($0 \leq x \leq 1$, $0 \leq y \leq 1$).

54. An electronic device according to any of paragraphs 49-53 further comprising a region of high electron concentration underneath the front ohmic contact.

55. An electronic device according to any of paragraphs 31-47 wherein the depletion region has a p-n junction and further comprising an additional n-type semiconductor on the p-n junction to form a bipolar transistor.

56. A method of fabricating an electronic device comprising;
  (a) growing an active layer of $Ga_{1-x2-y2}Al_{x2}In_{y2}N$ ($0 \leq x2 \leq 1$, $0 \leq y2 \leq 1$) by vapor phase epitaxy on a first side of a substrate of $Ga_{1-x1-y1}Al_{x1}In_{y1}N$ ($0 \leq x1 \leq 1$, $0 \leq y1 \leq 1$) sliced from a bulk crystal of $Ga_{1-x1-y1}Al_{x1}In_{y1}N$ ($0 \leq x1 \leq 1$, $0 \leq y1 \leq 1$) grown in supercritical ammonia;
  (b) forming an Ohmic contact on a second side of the substrate;
  (c) forming a Schottky contact, metal-insulator-semiconductor structure or p-type semiconductor on the active layer;
  wherein
  (d) the substrate has a dislocation density of less than $10^5$ $cm^{-2}$;
  (e) the substrate has electron concentration higher than $10^{18}$ $cm^{-3}$;
  (f) the active layer has electron concentration of less than $10^{18}$ $cm^{-3}$;
  (g) the active layer has a thickness greater than a thickness of the depletion region for any applied voltage within an operation range of the device.

57. A method according to paragraph 56 wherein electron concentration of the active layer is less than $10^{16}$ $cm^{-3}$.

58. A method of fabricating an electronic device comprising;
  (a) growing an active layer of $Ga_{1-x2-y2}Al_{x2}In_{y2}N$ ($0 \leq x2 \leq 1$, $0 \leq y2 \leq 1$) by vapor phase epitaxy on a first side of a substrate of $Ga_{1-x1-y1}Al_{x1}In_{y1}N$ ($0 \leq x1 \leq 1$, $0 \leq y1 \leq 1$) sliced from a bulk crystal of $Ga_{1-x1-y1}Al_{x1}In_{y1}N$ ($0 \leq x1 \leq 1$, $0 \leq y1 \leq 1$) grown in supercritical ammonia;
  (b) forming an Ohmic contact on a second side of the substrate;
  (c) forming a Schottky contact, metal-insulator-semiconductor structure or p-type semiconductor on the active layer;
  wherein
  (d) the substrate has a dislocation density of less than $10^5$ $cm^{-2}$;
  (e) the substrate has an oxygen concentration greater than $10^{18}$ $cm^{-3}$;
  (f) the active layer has an oxygen concentration of less than $10^{18}$ $cm^{-3}$;
  (g) the active layer has a thickness greater than a thickness of the depletion region for any applied voltage within an operation range of the device.

59. A method according to paragraph 58 wherein the oxygen concentration of the active layer is less than $10^{16}$ $cm^{-3}$.

60. A method of fabricating an electronic device according to any of paragraphs 56-59 wherein step (a) includes growth of a transition layer of $Ga_{1-x3-y3}Al_{x3}In_{y3}N$ ($0 \leq x3 \leq 1$, $0 \leq y3 \leq 1$) between the substrate and the active layer.

61. A method of fabricating an electronic device according to any of paragraphs 56-60 further comprising the following steps before growing the active layer;
  (a) forming a dielectric layer on the first side of the substrate;
  (b) forming a hole in the dielectric layer to expose a portion of the first side of the substrate;
    wherein the Schottky contact, metal-insulator-semiconductor structure or p-type semiconductor is formed above the hole in the dielectric layer.

62. A method of fabricating an electronic device according to paragraph 61 wherein the dielectric layer comprises silicon dioxide.

63. A method of fabricating an electronic device according to paragraph 61 or paragraph 62 wherein the transition layer and/or the active layer is formed using vapor phase epitaxy that deposits the layer's material selectively in the hole of the dielectric layer and then laterally.

64. A method of fabricating an electronic device according to paragraph 63 wherein the material deposited laterally extends to an adjacent device on the substrate so that the active layer forms a continuous film.

65. A method of fabricating an electronic device according to paragraph 63 wherein the material deposited laterally does not extend to an adjacent device on the substrate so that the active layer forms a discontinuous film.

66. The invention of any paragraph above wherein $x1=x2=x3=0$ and $y1=y2=y3=0$.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

The following references are incorporated by reference herein:

[1] R. Dwiliński, R. Doradziński, J. Garczyński, L. Sierzputowski, Y. Kanbara, U.S. Pat. No. 6,656,615.

[2] R. Dwiliński, R. Doradziński, J. Garczyński, L. Sierzputowski, Y. Kanbara, U.S. Pat. No. 7,132,730.

[3] R. Dwiliński, R. Doradziński, J. Garczyński, L. Sierzputowski, Y. Kanbara, U.S. Pat. No. 7,160,388.

[4] K. Fujito, T. Hashimoto, S. Nakamura, International Patent Application No. PCT/US2005/024239, WO07008198.

[5] T. Hashimoto, M. Saito, S. Nakamura, International Patent Application No. PCT/US2007/008743, WO07117689. See also US20070234946, U.S. application Ser. No. 11/784,339 filed Apr. 6, 2007.

[6] D'Eyelyn, U.S. Pat. No. 7,078,731.

Each of the references above is incorporated by reference in its entirety as if put forth in full herein, and particularly with respect to description of methods of making using ammonothermal methods and using these gallium nitride substrates.

What is claimed is:

1. A method of fabricating an electronic device comprising;
  (a) growing an active layer of $Ga_{1-x2-y2}Al_{x2}In_{y2}N$ ($0 \leq x2 \leq 1$, $0 \leq y2 \leq 1$) by vapor phase epitaxy on a first side of a substrate of $Ga_{1-x1-y1}Al_{x1}In_{y1}N$ ($0 \leq x1 \leq 1$, $0 \leq y1 \leq 1$) sliced from a bulk crystal of $Ga_{1-x1-y1}Al_{x1}In_{y1}N$ ($0 \leq x1 \leq 1$, $0 \leq y1 \leq 1$) grown in supercritical ammonia;

(b) forming an Ohmic contact on a second side of the substrate;
(c) forming a Schottky contact, metal-insulator-semiconductor structure or p-type semiconductor on the active layer;

wherein (d) the substrate has a dislocation density of less than $10^5$ cm$^{-2}$;
(e) the substrate has electron concentration or an oxygen concentration higher than $10^{18}$ cm$^{-3}$;
(f) the active layer has an electron concentration or an oxygen concentration of Less than $10^{18}$ cm$^{-3}$;
(g) the active layer has a thickness greater than a thickness of the depletion region for any applied voltage within an operation range of the electronic device, and wherein the active layer has a concentration of sodium at least 100 times less than a concentration of sodium of the substrate, and the sodium concentration of the substrate is greater than $10^{16}$ cm$^{-3}$.

2. A method according to claim 1 wherein the electron concentration of the active layer is less than $10^{16}$ cm$^{-3}$.

3. A method according to claim 1 wherein the oxygen concentration of the active layer is less than $10^{16}$ cm$^{-3}$.

4. A method according to claim 1 wherein step (a) includes growth of a transition layer of Ga$_{1-x3-y3}$Al$_{x3}$In$_{y3}$N ($0 \le x3 \le 1$, $0 \le y3 \le 1$) between the substrate and the active layer.

5. A method according to claim 4 and further comprising varying an impurity concentration of the transition layer as the transition layer is grown.

6. A method according to claim 4 and further comprising varying composition of the transition layer as the transition layer is grown.

7. A method according to claim 4 wherein x3=0 and y3=0.

8. A method according to claim 7 wherein x1=x2=0 and y1=y2=0.

9. A method according to claim 1 wherein x1=x2=0 and y1=y2=0.

10. A method according to claim 1 further comprising the following two steps before growing the active layer:
(i) forming a dielectric layer on the first side of the substrate; and
(ii) forming a hole in the dielectric layer to expose a portion of the first side of the substrate;
and wherein said Schottky contact, metal-insulator-semiconductor structure or p-type semiconductor is formed above the hole in the dielectric layer.

11. A method according to claim 10 wherein a transition layer and/or the active layer is formed using vapor phase epitaxy that deposits said layer's material selectively in the hole of the dielectric layer and laterally on a surface of the dielectric layer.

12. A method of fabricating an electronic device comprising:
(a) growing an active layer of Ga$_{1-x2-y2}$Al$_{x2}$In$_{y2}$N ($0 \le x2 \le 1$, $0 \le y2 \le 1$) by vapor phase epitaxy on a first side of a substrate of Ga$_{1-x1-y1}$Al$_{x1}$In$_{y1}$N ($0 \le x1 \le 1$, $0 \le y1 \le 1$) sliced from a bulk crystal of Ga$_{1-x1-y1}$Al$_{x1}$In$_{y1}$N ($0 \le x1 \le 1$, $0 \le y1 \le 1$) grown in supercritical ammonia;
(b) forming an Ohmic contact on a second side of the substrate;
(c) forming a Schottky contact, metal-insulator-semiconductor structure or p-type semiconductor on the active layer;

wherein (d) the substrate has a dislocation density of less than $10^5$ cm$^{-2}$;
(e) the substrate has electron concentration or an oxygen concentration higher than $10^{18}$ cm$^{-3}$;
(f) the active layer has an electron concentration or an oxygen concentration of less than $10^{18}$ cm$^{-3}$; and further comprising the following two steps before growing the active layer:
(i) forming a dielectric layer on the first side of the substrate; and
(ii) forming a hole in the dielectric layer to expose a portion of the first side of the substrate;
and wherein said Schottky contact, metal-insulator-semiconductor structure or p-type semiconductor is formed above the hole in the dielectric layer; and wherein a transition layer and/or the active layer is formed using vapor phase epitaxy that deposits said layer's material selectively in the hole of the dielectric layer and laterally on a surface of the dielectric layer.

13. A method according to claim 12 wherein the Schottky contact, metal-insulator-semiconductor structure or p-type semiconductor is formed above the hole in the dielectric layer before growing the active layer.

14. A method according to claim 12 wherein the dielectric layer comprises silicon dioxide.

15. A method according to claim 12 wherein the material deposited laterally comprises the active layer, and the material extends to an adjacent device on the substrate so that the active layer forms a continuous film.

16. A method according to claim 12 wherein the material deposited laterally comprises the active layer, and the material does not extend to an adjacent device on the substrate so that the active layer forms a discontinuous film.

17. A method according to claim 8 wherein x1=x2=0 and y1=y2=0.

* * * * *